(12) United States Patent
Zhang et al.

(10) Patent No.: US 7,139,987 B2
(45) Date of Patent: Nov. 21, 2006

(54) ANALOG INTEGRATED CIRCUIT LAYOUT DESIGN

(75) Inventors: Gang Zhang, Pittsburgh, PA (US); Enis Aykut Dengi, Tempe, AZ (US); Ronald A. Rohrer, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 374 days.

(21) Appl. No.: 10/618,237

(22) Filed: Jul. 11, 2003

(65) Prior Publication Data

US 2004/0010764 A1 Jan. 15, 2004

Related U.S. Application Data

(60) Provisional application No. 60/395,156, filed on Jul. 11, 2002.

(51) Int. Cl.
*G06F 17/50* (2006.01)
(52) U.S. Cl. .................. 716/4; 716/5; 716/8; 716/9
(58) Field of Classification Search ............... 716/4–5, 716/7–8
See application file for complete search history.

(56) References Cited

U.S. PATENT DOCUMENTS

| 5,764,531 A | * | 6/1998 | Kojima et al. | 716/6 |
| 5,926,397 A | * | 7/1999 | Yamanouchi | 716/14 |
| 6,230,304 B1 | * | 5/2001 | Groeneveld et al. | 716/7 |
| 6,425,110 B1 | * | 7/2002 | Hathaway et al. | 716/2 |

OTHER PUBLICATIONS

R. Harjani, R.A. Rutenbar and L.R. Carley, "Oasyss: A Framework for Analog Circuit Synthesis", IEEE Transactions on Computer-Aided Design, vol. 8, No. 12, pp. 1247-1266, (Dec. 1989).
M.G.R. Degrauwe, O. Nys, E. Dijkstra, J. Rigmenants, S. Bitz, B.L.A.G. Goffart, E.A. Vittoz, S. Cserveny, C. Meixenberger, G. Van Der Stappen, and H. J. Oguey, "IDAC: An Interactive Design Tool for Analog CMOS Circuits", IEEE Journal of Solid State Circuits, vol. Sc-22, No. 6, pp. 1106-1166, (Dec. 1987).
H.Y. Koh, C.H. Sequin and R.R. Gray, "OPASYN: A Compiler for CMOS Operational Amplifiers", IEEE Transactions on Computer Aided Design, vol. 9, No. 2, pp. 113-125 (Feb. 1990).
E. Ochotta, L.R. Carley and R.A. Rutenbar, "Analog Circuit Synthesis for Large, Realistic Cells: Designing a Pipelined A/D Converter with ASTRX/OBLX", in Proc., IEEE Custom Integrated Circuit Conference, pp. 365-368, (1994).

(Continued)

*Primary Examiner*—Jack Chiang
*Assistant Examiner*—Brandon W. Bowers
(74) *Attorney, Agent, or Firm*—Morrison & Foerster LLP (57) ABSTRACT

In an automated integrated circuit design, if the performances of a layout of circuit devices are not within predetermined tolerances of performance specifications, at least one of the circuit devices is resized or repositioned and an updated value of a device parameter for each resized or repositioned circuit device is determined. A difference between the initial and updated value of each device parameter is then determined and each difference is combined with a ratio formed from changes in the value of one of the device parameters and changes in the value of one of the performances affected by the device parameter. The result of this combination is then combined with the initial value of the performance to determine an updated value therefor.

24 Claims, 6 Drawing Sheets

OTHER PUBLICATIONS

R. Phelps, M. Krasnicki, R.A. Rutenbar, L.R. Carley and J.R. Hellums, "A Case Study of Synthesis for Industrial-Scale Analog IP: Redesign of the Equalizer/Filter Frontend for an ADSL CODEC", ACM/IEEE Design Automation Conference, pp. 1-6 (Jun. 2000).

G.G.E. GIELEN and R.A. Rutenbar, "Computer-Aided Design of Analog And Mixed-Signal Integrated Circuits", Proceedings of the IEEE, vol. 88, No.12, pp. 1825-1852 (Dec. 2000).

J. Rijmenants, J.B. Litsios, T.R. Schwarz and M.G.R. Degrauwe, "ILAC: An Automated Layout Tool for Analog CMOS Circuits", IEEE Journal of Solid State Circuits, vol. 24, No. 2, pp. 417-425, (Apr. 1989).

E. Felt, E. Malavasi, E. Charbon, R. Totaro and A. Sangiovanni-Vincentelli, "Performance-Driven Compaction for Analog Integrated Circuits", IEEE 1993 Custom Integrated Circuits Conference, pp. 17.3.1-17.3.5, (1993).

U. Choudhury and A. Sangiovanni-Vicentelli, "Constraint Generation for Routing Analog Circuits", 27th ACM/IEEE Design Automation Conference, pp. 561-566, (Jun. 1990).

E. Charbon, E. Malavasi, U. Choudhury, A. Casotto and A. Sangiovanni-Vicentelli, "A Constraint-Driven Placement Methodology for Analog Integrated Circuits", IEEE 1992 Custom Integrated Circuits Conference, pp. 28.2.1-28.2.4, (May 1992).

E. Charbon, E. Malavasi, D. Pandini and A. Sangiovanni-Vincentelli, "Imposing Tight Specifications on Analog IC's Through Simultaneous Placement and Module Optimization", IEEE 1994 Custom Integrated Circuits Conference, pp. 525-528, (May 1994).

E. Charbon, G. Holmlund, A. Sangiovanni-Vicentelli and B. Donecker, "A Performance-Driven Router for RF and Microwave Analog Circuit Design", IEEE 1995 Custom Integrated Circuits Conference, pp. 383-386; (May 1995).

E. Malavasi and A. Sangiovanni-Vicentelli, "Area Routing for Analog Layout", IEEE Transactions on Computer-Aided Design of Integrated Circuits and Systems, vol. 12, No. 8, pp. 1186-1197, (Aug. 1993).

E. Malavasi and A. Sangiovanni-Vicentelli, "Dynamic Bound Generation for Constraint-Driven Routing", IEEE 1995 Custom Integrated Circuits Conference, pp. 477-480, (May 1995).

P. Vancorenland, G. Van Der Plas, M. Steyaert, G. Gielen, and W. Sansen, "A Layout-Aware Synthesis Methodology for RF Circuits", 2001 IEEE, pp. 358-362, (2001).

K. Lampaert, G. Gielen and W. Sansen, "Direct Performance-Driven Placement of Mismatch-sensitive Analog Circuits", 32nd ACM/IEEE Design Automation Conference, pp. 445-449, (Jun. 1995).

B. Arsintescu, and R.H.J.M. Otten, "Constraints Space Management for the Layout of Analog IC's", Proc. IEEE International Conference on Computer Aided Design (1996).

J.M. Cohen, D.J. Garrod, R.A. Rutenbar and L.R. Carley, "KOAN/ANAGRAM II: New Tools For Device-Level Analog Placement and Routing", IEEE Journal of Solid-State Circuits, vol. 26, No. 3, pp. 330-342 (Mar. 1991).

S. Mitra, S.K. Nag, R.A. Rutenbar and L.R. Carley, "System-Level Routing of Mixed-Signal ASICs in WREN", Proc. IEEE Conference on Computer Aided Design, pp. 394-399, (Nov. 1992).

S. Mitra, R.A. Rutenbar, L.R. Carley and D. J. Allstot, "Substrate-Aware Mixed-Signal Macro-Cell Placement in Wright", IEEE Journal of Solid-State Circuits, vol. 30, No. 3, pp. 269-278, (Mar. 1995).

G. Zhang, A. Dengi, and L.R. Carley, "Automatic Synthesis of a 2.1GHz SiGe Low Noise Amplifier", IEEE RFIC Symposium, pp. 1-4 (Jun. 2002).

* cited by examiner

Fig 4

| Target Performance Specification | Tolerance |
|---|---|
| T1 | $\pm x1\%$ |
| T2 | $+ x2\%$ |
| T3 | $+ x3$ |
| T4 | $- x4$ |
| T5 | $\pm x5$ |
| T6 | $- x6\%$ |
| ⋮ | ⋮ |

Fig 5

ANALOG INTEGRATED CIRCUIT LAYOUT DESIGN

CROSS REFERENCE TO RELATED APPLICATIONS

This application claims priority from U.S. Provisional Patent Application Ser. No. 60/395,156, filed Jul. 11, 2002.

BACKGROUND OF THE INVENTION

1. Field of the Invention

The present invention relates to integrated circuit design, and, more particularly, to the automated design of radio frequency and high speed analog integrated circuits.

2. Description of Related Art

The electrical design and physical implementation of integrated circuits, especially radio frequency and high speed analog circuits, are tightly coupled. To this end, parasitic electrical effects resulting from the routing of conductors to interconnect circuit devices must be taken into consideration during front-end electrical synthesis. On the other hand, the back-end layout of circuit devices must be carried out in such a way that target performance specifications are guaranteed to be met. In practice, several iterations between circuit design and layout are typically required to achieve final design closure. This process is time consuming and is usually guided only by a designer's experience and expert knowledge about the circuit and layout. Although separate analog layout tools and circuit synthesis tools are available, heretofore no tool has been available to automate the overall process.

A drawback of existing layout approaches is that they all assume the circuit schematic is fixed when laying out the circuit devices. Consequently, the device parameters for the circuit devices utilized to implement the circuit are translated into hard constraints for layout. So, if one intermediate placement of a circuit device or the routing of an interconnecting conductor violates one performance specification, the entire design is marked as costly or infeasible. In this way, the layout of circuit devices and the routing of interconnecting conductors is over restricted.

Therefore what is needed is a method and apparatus for automatically generating and revising a layout of circuit devices and the routing of the interconnecting conductors of a circuit whereupon the circuit meets or is within predetermined tolerances of target performance specifications for the circuit.

SUMMARY OF THE INVENTION

The invention is an automated analog integrated circuit design method. The method includes defining performance specifications for a circuit formed from a plurality of interconnected circuit devices. At least one constraint is defined on the relative placement of each circuit device with respect to at least one other circuit device. The circuit devices are laid out subject to each constraint, wherein each circuit device is assigned an initial size that establishes an initial value of a device parameter therefor. Initial values of performances for the circuit are determined from the layout of the circuit devices. For each performance, device parameter pair, e.g., (x, y) pair, a ratio of changes of the values thereof is determined. If at least one performance is not within a predetermined tolerance of the corresponding performance specification, one of the circuit devices is chosen. The chosen circuit device is resized and an updated value of the device parameter for the resized circuit device is determined. A first value is determined between the updated value of the device parameter and the initial value of said device parameter. For each ratio associated with the initial value of the device parameter having its updated value thus determined, said ratio is combined (multiplied) with said first value to obtain a second value. For each ratio having a thus determined second value, said second value is combined (summed) with the initial value of the performance associated with said ratio to determine an updated value for said performance. The foregoing steps of determining whether the performances are within the predetermined tolerances of the performance specifications, the resizing of the chosen circuit device and the determination of updated values of the device parameter and a corresponding performance continues until the performances are within the predetermined tolerances of the performance specifications.

The step of determining a ratio of each performance, device parameter pair can include forming an array of ratios wherein each ratio represents changes in the value of the corresponding performance as a function of changes in the value of the corresponding device parameter.

When the performances are within the predetermined tolerances of the performance specifications, the layout of the circuit devices, including the size of each device, associated with the performances can be output as the circuit design.

The step of laying out the circuit device subject to the constraints can also include routing conductors to electrically interconnect the laid out circuit devices and determining for each routed conductor an electrical parasitic effect associated therewith. The step of determining initial values of performances for the circuit can include determining the performances based on the size of each device and the electrical parasitic effect of each conductor.

The step of choosing one of the circuit devices in response to the performances not being within the predetermined tolerances of the performance specifications can include randomly choosing the one circuit device.

The invention is also a computer readable medium having stored thereon instructions which, when executed by a processor, cause the processor to: (a) receive performance specifications for a circuit formed from a plurality of interconnected circuit devices; (b) receive at least one constraint on the relative placement of each circuit device with respect to at least one other circuit device; (c) layout the circuit devices subject to each constraint, wherein each circuit device is assigned a size that establishes at least one device parameter therefor; (d) determine performances for the circuit from the layout of the circuit devices; (e) define a relationship between each performance and each device parameter; (f) if at least one performance is not within a predetermined tolerance of the corresponding performance specification, choose one circuit device; (g) resize the chosen circuit device; (h) determine a change in at least one device parameter for the resized circuit device; (i) determine for each change in step (h) a change in at least one performance based on at least one relationship defined in step (e); and (f) repeat steps (f)–(i) until the current performances are within the predetermined tolerances of the target performances.

Lastly, the invention is an automated analog integrated design method that includes: (a) defining performance specifications for a circuit formed from a plurality of interconnected circuit devices; (b) defining at least one constraint on the relative placement of each circuit device with respect to at least one other circuit device; (c) laying out the circuit devices subject to each constraint, wherein each circuit device is assigned a size that establishes at least one device parameter therefor; (d) routing conductors to electrically interconnect the laid out circuit devices whereupon the routing of each conductor establishes an electrical parasitic effect therefor; (e) determining performances for the circuit from the layout of the circuit devices and the routing of the conductors; (f) defining a relationship for each performance, device parameter pair; (g) defining a relationship for each performance, parasitic effect pair; (h) if at least one performance is not within a predetermined tolerance of the corresponding performance specification, choosing one circuit device; (i) randomly resizing or repositioning the chosen circuit device; (j) in response to resizing the one circuit device, repeating steps (h) and (i) after determining a change in at least one performance for the one circuit device utilizing at least one relationship defined in step (f); and (k) in response to repositioning the one circuit device, repeating steps (h) and (i) after determining a change in at least one performance for the one circuit device utilizing at least one relationship defined in step (g).

Step (f) can include forming an array of ratios of changes of performances versus changes of device parameters and step (g) can include forming an array of ratios of changes of performances versus changes of parasitic effects.

DETAILED DESCRIPTION OF THE INVENTION

The present invention will be described with reference to the accompanying figures where like reference numbers correspond to like elements.

The present invention is a method which is desirably embodied in computer readable program code which executes on a processor of a computer system, e.g., a stand-alone or networked computer or workstation, that includes a computer storage, an input/output system, a media drive, such as a disk drive, CD ROM drive, etc., and a computer-usable storage medium capable of storing the computer readable program code that embodies the present invention. Under the control of the computer readable program code, the processor is capable of configuring and operating the computer system in a manner to implement the present invention. Computer systems of the type described above are well known in the art and are not described herein for purpose of simplicity.

Figure 1:
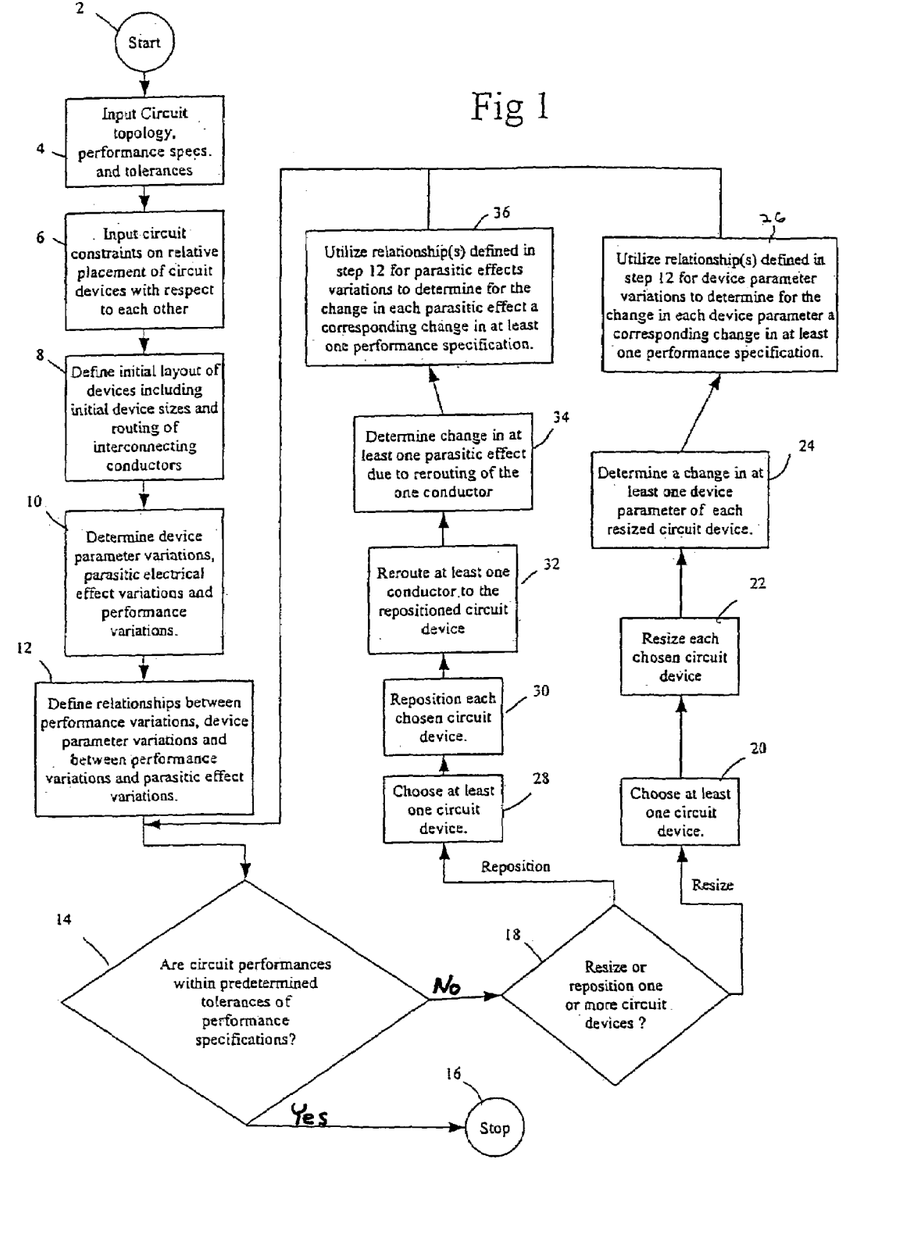
FIG. 1 is a flowchart of a method in accordance with the present invention.
Figure 2:
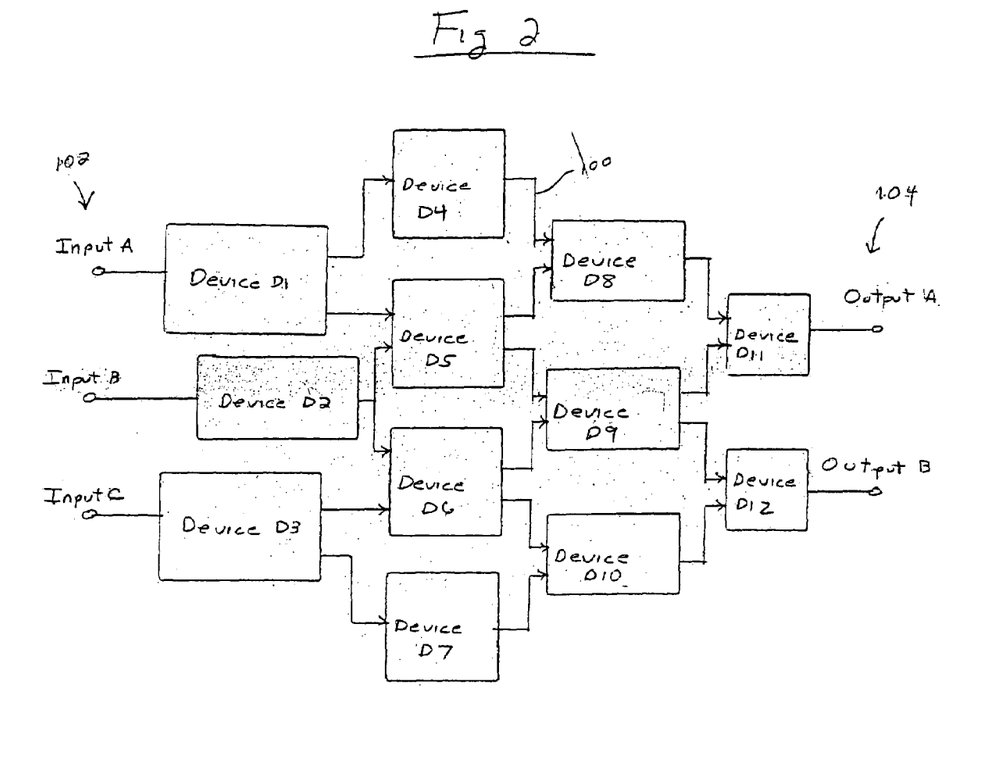
FIG. 2 is an exemplary layout of circuit devices D including conductors interconnecting the circuit devices D between one or more inputs and one or more outputs.

With reference to FIGS. 1 and 2, the method begins by advancing from a start step 2 to a step 4 where a circuit topology of a circuit, performance specifications for the circuit and tolerances for the performance specifications are input into the computer system. The circuit topology includes a collection of active and passive circuit devices, e.g., D1–D12, interconnected by conductors 100 to desirably perform a predetermined function. The performance specifications establish the goals for performances of the circuit and the tolerances define a permissible range that one or more circuit performances can deviate from corresponding performance specifications. As used herein, the term "performance" denotes an actual or calculated characteristic of the circuit, such as gain, bandwidth, and the like. In contrast, the phrase "performance specification" denotes a goal for one of the performances of the circuit.

The method then advances to a step 6 where circuit constraints on the relative placement of the circuit devices with respect to each other are input into the computer system. Examples of circuit constraints include (1) device D1 is above device D2, (2) device D3 is below device D2, (3) device D4 is to the right of device D1, (4) device D4 is above device D5, and the like.

Once the circuit topology, performance specifications and circuit constraints have been input into the computer system, the method advances to a step 8 where an initial circuit layout is defined. This initial circuit layout includes the initial placement of circuit devices D1–D12, the initial sizes of circuit devices D1–D12 and the routing of conductors 100 that electrically interconnect circuit devices D1–D12. The placement and initial sizes of circuit devices D1–D12 and the routing of the conductors 100 in step 8 are based on the circuit topology, performance specifications and circuit constraints input into the computer system in step 4. An exemplary initial layout of circuit devices D1–D12, including an initial routing of conductors 100 to interconnect circuit devices D1–D12 between one or more inputs 102 and one or more outputs 104, is illustrated in FIG. 2.

Next, program flow advances to step 10 where variations of device parameters for each circuit device D based on changes in the size thereof and variations of the parasitic electrical effect of each conductor based on changes in the routing thereof are determined utilizing tools well known in the art, e.g., a circuit simulator. More specifically, a first value of at least one device parameter is determined for each circuit device D based on the initial size thereof. Thereafter, each circuit device D is resized, one circuit device D at a time, relative to the initial size of each other circuit device D and a second value of the device parameters is determined for said resized circuit device D. For each circuit device D, a difference is ($\Delta$) taken between the first and second values of each device parameter. Similarly, a first value of a parasitic electrical effect is determined for each conductor based on the initial routing thereof. Thereafter, each conductor is rerouted, one conductor at a time, relative to the initial routing of the other conductors and a second value of the parasitic electrical effect is determined for said rerouted conductor. For each conductor, a difference ($\Delta$) is taken between the first value of the parasitic electrical effect and the second value of the parasitic electrical effect.

For the variations in the values of each device parameter of a circuit device D based on the resizing thereof, a corresponding change in the values of one or more performances of the circuit is determined in a manner well known in the art. Similarly, for the variations in the values of each parasitic electrical effect of a conductor based on the rerouting thereof, a corresponding change in the values of one or more performances of the circuit is determined in a manner well known in the art.

Figure 3A:
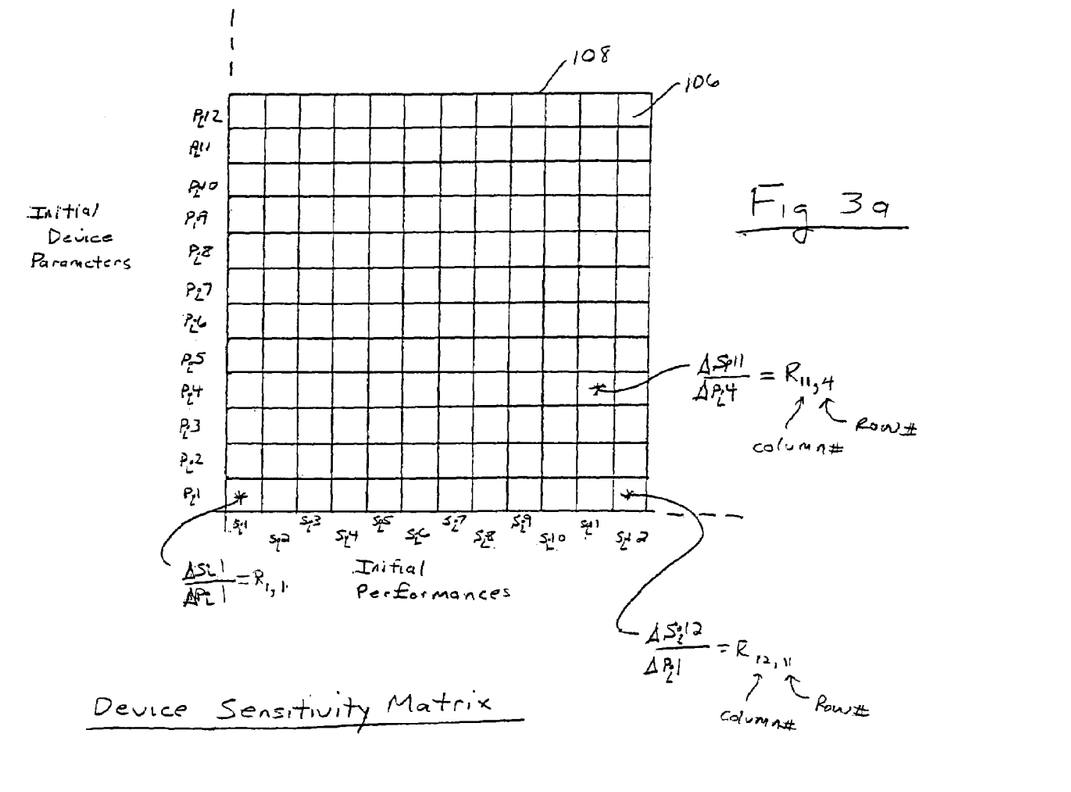
FIG. 3a is a device sensitivity matrix of performances versus device parameters including in each cell thereof a ratio of a performance variations over device parameter variations.
Figure 3B:
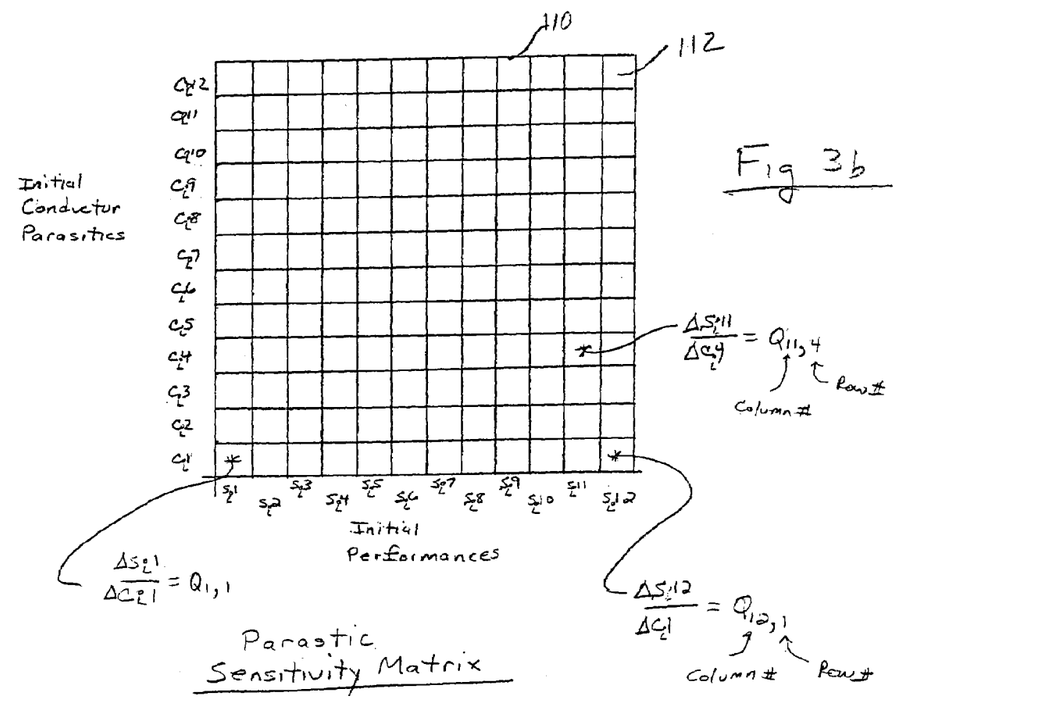
FIG. 3b is a parasitic sensitivity matrix of performances versus conductor parasitics including in each cell thereof a ratio of a performance variations over conductor parasitic variations.

With reference to FIGS. 3a and 3b, and with continuing reference to FIGS. 1 and 2, program flow then advances to step 12 where a relationship is defined for each initial performance, initial device parameter pair, e.g., (x, y) pair. To enhance the use thereof, these relationships can be input into cells 106 of a device sensitivity matrix 108 that has the initial performances and the initial device parameters representing different axes thereof. For the purpose of describing the invention, it will be assumed that these relationships are input into the cells 106 of device sensitivity matrix 108. However, this is not to be construed as limiting the invention.

Each relationship input into a cell 106 of device sensitivity matrix 108 is in the form of a ratio R of the change in the values of the performance $\Delta S_i$ over the change the values of the corresponding device parameter $\Delta P_i$, or vice versa. For example, cell 106 at the intersection of initial performance $S_i 11$ and initial device parameter $P_i 4$ includes the ratio $R_{11,4} = \Delta S_i 11/\Delta P_i 4$. Similarly, cell 106 at the intersection of initial performance $S_i 12$ and initial device parameter $P_i 1$ includes the ratio $R_{12,1} = S_i 12/\Delta P_i 1$. For simplicity of illustration, only a few ratios R are shown in cells 106 of device sensitivity matrix 108. However, it is to be appreciated that each cell 106 of device sensitivity matrix 108 desirably has a ratio R included therein.

In step 12, a relationship is also defined between each initial performance, initial parasitic effect pair. To enhance the use thereof, these relationships can be input into cells 112 of a parasitic sensitivity matrix 110 that has the initial performances and the initial parasitic effects representing different axes thereof. For the purpose of describing the invention, it will be assumed that these relationships are input into the cells 112 of parasitic sensitivity matrix 110. However, this is not to be construed as limiting the invention.

Each relationship input into a cell 112 of parasitic sensitivity matrix 110 is in the form of a ratio Q of change of the values of the performance $\Delta S_i$ over the change of the values of the corresponding parasitic effect $C_i$, or vice versa. For example, cell 112 at the intersection of initial performance $S_i 11$ and initial conductor parasitic $C_i 4$ can include the ratio $Q_{11,4} = \Delta S_i 11/\Delta C_i 4$. Similarly, cell 112 at the intersection of initial performance specification $S_i 12$ and initial conductor parasitic $C_i 1$ can include the ratio $Q_{12,1} = \Delta S_i 12/\Delta C_i 1$. For simplicity of illustration, only a few ratios Q are shown input into cells 112 of parasitic sensitivity matrix 110. However, it is to be appreciated that each cell 106 of parasitic sensitivity matrix 110 desirably has a ratio Q included therein.

Figure 4:
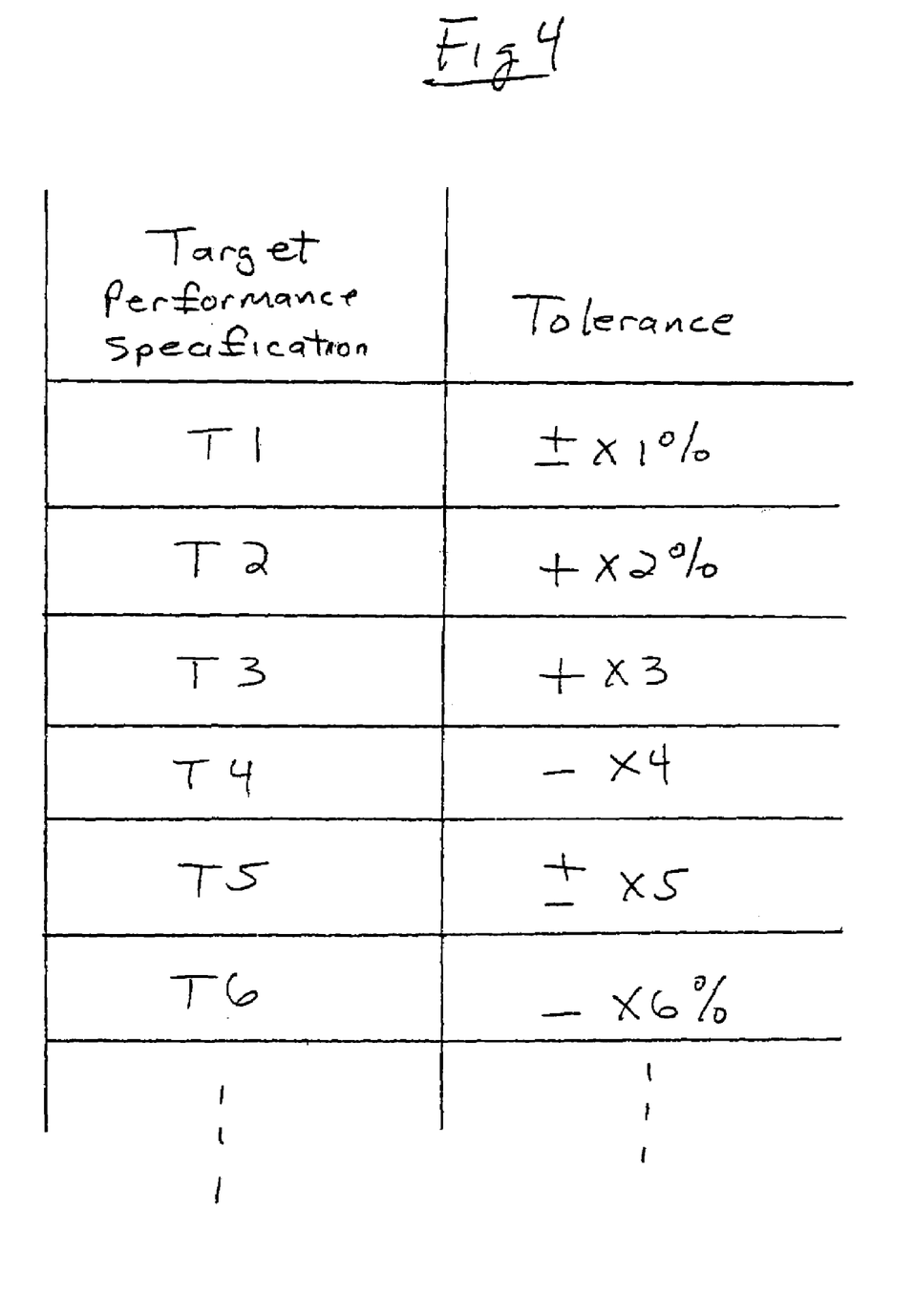
FIG. 4 is a chart showing the relationship between performance specifications and corresponding tolerances.

With reference to FIG. 4, and with continuing reference to all previous figures, for each performance specification T1, T2, T3, etc., input in step 4, a corresponding predetermined tolerance X1, X2, X3, etc., respectively, is also input. Each tolerance X represents, for example, a percentage that each performance of the circuit, e.g., gain, bandwidth and the like, must be within the corresponding performance specification in order to be acceptable; a minimum and/or maximum value that each performance must not be below or above, respectively, the corresponding performance specification in order to be acceptable; and the like. The foregoing exemplary tolerances, however, are not to be construed as limiting the invention since the use of other tolerances is envisioned.

Next, program flow advances to step 14 where it is determined if each performance of the circuit is within the predetermined tolerance of the corresponding performance specification. If so, program flow advances to stop step 16 wherein the circuit design that includes the location and size of each circuit device associated with the current performances of the circuit along with the routing of conductors 100 therebetween can be output as the final circuit design. Stop step 16 can also include any desirable circuit and/or layout analysis tool, e.g., a circuit simulator, for analyzing the circuit design to ensure that the performances of the circuit are with the predetermined tolerances of the performance specifications. In this manner, stop step 16 can ensure the circuit design, in-fact, performs as required prior to outputting the circuit design as the final circuit design. Otherwise, stop step 16 can output a suitable warning or error message that advises that the circuit design does not meet the performance specifications.

However, if at least one performance of the circuit is not within the predetermined tolerance of the corresponding performance specification, program flow advances to step 18 where a decision is made whether to resize or reposition one or more circuit devices in an attempt to affect the circuit layout such that the performances fall within the predetermined tolerances of the performance specifications. The decision to resize or reposition one or more circuit devices is desirably made randomly, either automatically or manually. However, this is not to be construed as limiting the invention.

If the decision in step 18 is to resize one or more circuit devices, program flow advances to step 20 where at least one circuit device is chosen, desirably randomly. However, this is not to be construed as limiting the invention.

Figure 5:
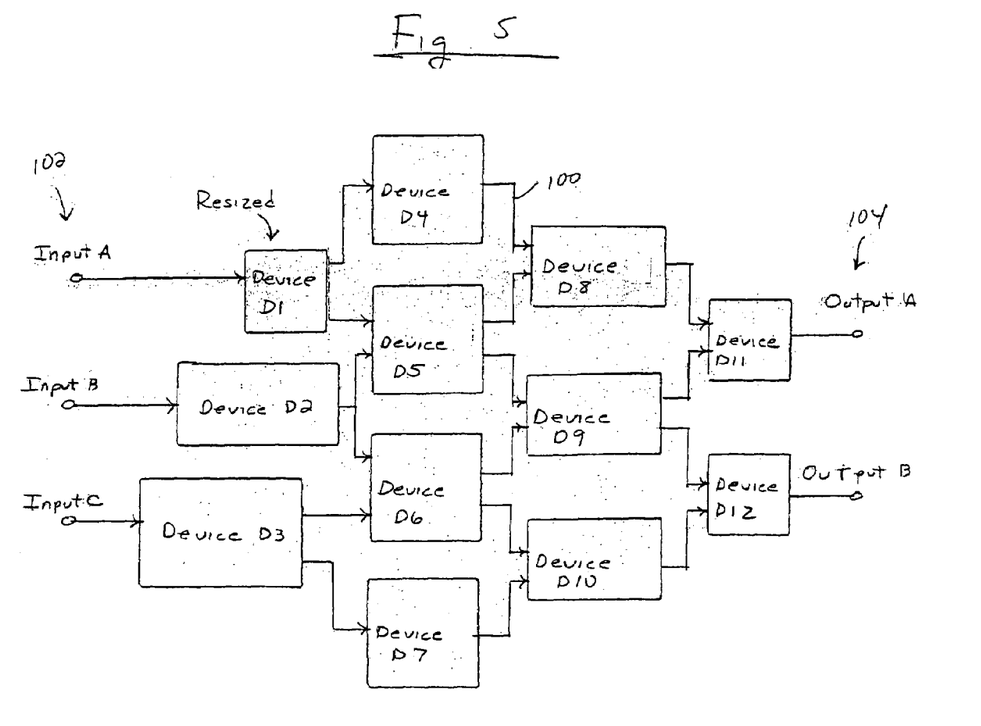
FIG. 5 is the circuit layout of FIG. 2 including resized circuit device D1.

With reference to FIG. 5, and with continuing reference to FIGS. 1–4, program flow then advances to step 22 where each circuit device chosen in step 20 is resized. For example, if device D1 in FIG. 2 is chosen in step 20, it can be resized, for example, to the size shown in FIG. 5. The extent of resizing device D1 from the size shown in FIG. 2 to the size shown in FIG. 5, however, is not to be construed as limiting the invention. Moreover, the reduction in the size of device D1 from FIG. 2 to FIG. 5 is not to be construed as limiting the invention since the size of device D1 can alternatively be increased. Once each chosen circuit device has been resized in step 22, program flow advances to step 24 where a new value for each device parameter of each resized circuit device is determined in a manner well known in the art.

Program flow then advances to step 26 where a difference (or first value) is determined between the new value of each device parameter and the initial value of said device parameter. More specifically, the new value of each device parameter is subtracted from the initial value of said device parameter. Each thus determined first value and its sign, i.e., +or −, is then combined with each ratio R associated with the initial value of the device parameter utilized to determine said first value to determine a second value associated with said ratio R. More specifically, each second value is determined by taking the product of the first value times the ratio R in each cell 106 of device sensitivity matrix 108 associated with the initial value of the device parameter. Each thus determined second value is then combined with the initial performance associated with the ratio R utilized to determine said second value to determine an updated, or new, value for the performance. More specifically, the new value of each performance is determined by taking the sum of the initial value of the performance plus the thus determined second value. Each performance having its value updated in the foregoing manner along with the initial values of any performance not updated, if any, constitute the current performances for the circuit with the resized circuit device (s).

An illustrative example of how the value of a performance changes in response to a change in the value of a device parameter will now be described with reference to FIG. 3a. Suppose that the value of device parameter P1 changes from an initial value $P_i1$ to a new value $P_n1$ in response to resizing device D1. In step 26, the initial value of device parameter $P_i1$ is subtracted from the new value of device parameter $P_n1$ to determine the first value $P_A1$. This first value $P_A1$ is then multiplied by the ratio $R_{1,1}$ to determine the second value $S_A1$ that is summed with the initial value of performance $S_i1$ to obtain the updated, or new, value for said performance.

Similarly, each ratio $R_{x,1}$ included in a cell 106 of the row associated with initial device parameter $P_i1$ is multiplied by the first value $P_A1$ to determine the corresponding second value $S_AX$ that is summed with the initial value of performance $S_iX$ associated with the ratio in the cell 106 to obtain the updated, or new, value for said performance, where X=2, 3, . . . 12, in the present example.

Once the values of the initial performances have been updated in the foregoing manner, the updated values of the performances along with the value of any performance not updated, if any, comprise the current performances for the circuit with the resized circuit device(s).

Once step 26 is complete, program flow returns to step 14 where a determination is made whether the performances are within the predetermined tolerances of the performance specifications. If so, program flow advances to stop step 16. If not, program flow returns to step 18 where the decision is made whether to resize or reposition at least one circuit device.

With particular reference to FIGS. 1 and 3b, suppose in this iteration of step 18, the decision is made to reposition at least one circuit device. If so, program flow advances to step 28 where at least one circuit device is chosen, desirably randomly. Thereafter, program flow advances to step 30 where each chosen circuit device is repositioned to define a new circuit layout. Program flow then advances to step 32 where at least one conductor is rerouted to the repositioned circuit device.

Program flow then advances to step 34, where a new value of at least one parasitic effect for each rerouted conductor is determined in a manner well known in the art. Program flow then advances to step 36 where a change in at least one performance as a function of a change in at least one parasitic electrical effect is determined in the manner described above for changing at least one performance as a function of a change in at least one device parameter. Specifically, a difference (or first value) $C_A$ is determined between each new value of a parasitic effect $C_n$ and the initial value of the parasitic effect $C_i$ for each rerouted conductor. More specifically, the new value of said parasitic effect $C_n$ is subtracted from the initial value of the parasitic effect $C_i$.

Each thus determined first value $C_A$ and its sign, i.e., + or −, is then combined with each ratio Q formed from the initial value of the parasitic effect $C_i$ utilized to determine the first value $C_A$ to determine a second value $S_A$ therefor. More specifically, each second value $S_A$ is determined by taking the product of the corresponding first value $C_A$ times the corresponding ratio Q in a cell 112 of parasitic sensitivity matrix 110. Each thus determined second value $S_A$ is then summed with the initial value of the performance $S_i$ associated with the ratio to determine an updated, or new, value for said performance. Each performance having its value updated in the foregoing manner along with the values of any performance not updated, if any, comprise the current performances for the circuit with the repositioned circuit devices.

Once step 36 is complete, program flow returns to step 14 where a determination is made whether the performances are within the predetermined tolerances of the performance specifications. If so, program flow advances to stop step 16. If not, program flow returns to step 18 where the decision is made whether to resize or reposition at least one circuit device. Steps 14–36 are repeated, as necessary, until stop step 16 is executed.

While step 14 requires the current performances to be within the predetermined tolerances of the performance specifications, other exit strategies can also or alternatively be utilized to terminate the method and cause program flow to advance to stop step 16. These other exit strategies can include, for example, expiration of a predetermined interval of time, exceeding a predetermined number of iterations of step 14, and the like. These other exit strategies, however, are not to be construed as limiting the invention.

As can be seen, the present invention enables rapid fine tuning of performances by resizing and/or repositioning one or more circuit devices whereupon the repeated use of computationally expensive methods for determining the performances are avoided.

Step 26 of the above-described embodiment of the present invention makes use of the assumption that each ratio R of the change in a performance versus a change in a device parameter is linear within the range of resizing to be attempted. However, this assumption may not be true in all cases. Thus, for example, if a device parameter changes sufficiently, the change in one or more performances may be nonlinear or complex. To avoid determining an incorrect value of a performance in this case, one or more cells 106 of device sensitivity matrix 108 can include a pointer to a location in the computer storage that includes an instantiation of (1) a nonlinear or complex performance versus device parameter model or (2) a higher speed, lower capacity simulator wherefrom a value representing the change in the performance as a function of the change in a device parameter can be derived or extracted and utilized to determine the updated, or new, value of the said performance for the cell.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. An automated integrated circuit design method comprising:
   (a) defining performance specifications for a circuit formed from a plurality of interconnected circuit devices;
   (b) defining at least one constraint on the relative placement of each circuit device with respect to at least one other circuit device;
   (c) laying out the circuit devices subject to each constraint, wherein each circuit device is assigned an initial size that establishes an initial value of a device parameter therefor;
   (d) determining initial values of performances for the circuit from the layout of the circuit devices;

(e) determining a ratio of changes of the values for each performance, device parameter pair, (f) determining that at least one performance is not within a predetermined tolerance of the corresponding performance specification and choosing one of the circuit devices;

(g) resizing the chosen circuit device;

(h) determining an updated value of the device parameter for the resized circuit device;

(i) determining a first value as a difference between the updated value of the device parameter and the initial value of said device parameter;

(j) for each ratio associated with the initial value of the device parameter having its value updated in step (h), multiplying said ratio with said first value to obtain a second value;

(k) for each ratio having the second value determined therefor in step (j), combining said second value with the initial value of the performance associated with said ratio to determine an updated value for said performance; and (l) repeating steps (f)–(k) until the performances are within the predetermined tolerances of the performance specifications.

2. The method of claim 1, wherein step (e) includes forming an array of ratios, wherein each ratio represents changes in the value of the corresponding performance as a function of changes in the value of the corresponding device parameter.

3. The method of claim 1, further including, when the performances are within the predetermined tolerances of the performance specifications, outputting the layout of the circuit devices, including the size of each device, associated with the performances as the circuit design.

4. The method of claim 1, wherein:

step (c) further includes routing conductors to electrically interconnect the laid out circuit devices and determining for each routed conductor an electrical parasitic effect associated therewith; and step (d) includes determining the performances for the circuit based on the size of each device and the electrical parasitic effect of each conductor.

5. The method of claim 1, wherein step (f) includes randomly choosing the one circuit device.

6. A computer readable medium having stored thereon instructions for designing integrated circuits which, when executed by a processor, cause the processor to:

(a) receive performance specifications for a circuit formed from a plurality of interconnected circuit devices;

(b) receive at least one constraint on the relative placement of each circuit device with respect to at least one other circuit device;

(c) layout the circuit devices subject to each constraint, wherein each circuit device is assigned a size that establishes at least one device parameter therefor;

(d) determine performances of the circuit from the layout of the circuit devices;

(e) define a relationship between each performance and each device parameter;

(f) if at least one performance is not within a predetermined tolerance of the corresponding performance specification, choose one circuit device;

(g) resize the chosen circuit device;

(h) determine a change in at least one device parameter for the resized circuit device;

(i) determine for each change in step (h) a change in at least one performance based on at least one relationship defined in step (e); and (j) repeat steps (f)–(i) until the performances are within the predetermined tolerances of the performance specifications.

7. The computer readable medium of claim 6, wherein step (e) includes forming an array of ratios of changes of performance versus changes of device parameters, wherein each ratio represents changes in value of one performance as a function of changes in value of one device parameter.

8. The computer readable medium of claim 6, wherein the instructions cause the processor to perform the further step of:

output as the circuit design the layout of the circuit devices, including the size of each device, associated with the performances when said performances are within the predetermined tolerances of the performance specifications.

9. The computer readable medium of claim 6, wherein:

step (c) further includes route conductors to electrically interconnect the laid out circuit devices and determine for each routed conductor an electrical parasitic effect associated therewith; and step (d) includes determine the performance specifications for the circuit based on the size of each device and the electrical parasitic effect of each conductor.

10. An automated integrated circuit design method comprising:

(a) defining performance specifications for a circuit formed from a plurality of interconnected circuit devices;

(b) defining at least one constraint on the relative placement of each circuit device with respect to at least one other circuit device;

(c) laying out the circuit devices subject to each constraint, wherein each circuit device is assigned a size that establishes at least one device parameter therefor;

(d) routing conductors to electrically interconnect the laid out circuit devices whereupon the routing of each conductor establishes an electrical parasitic effect therefor;

(e) determining performances for the circuit from the layout of the circuit devices and the routing of the conductors;

(f) defining a relationship for each performance, device parameter pair;

(g) defining a relationship for each performance, parasitic effect pair;

(h) determining that at least one performance is not within a predetermined tolerance of the corresponding performance specification and choosing one circuit device;

(i) resizing or repositioning the chosen circuit device;

(j) in response to resizing the one circuit device, repeating steps (h) and (i) after determining a change in at least one performance of the one circuit device utilizing at least one relationship defined in step (f); and (k) in response to repositioning the one circuit device, repeating steps (h) and (i) after determining a change in at least one performance of the one circuit device utilizing at least one relationship defined in step (g).

11. The method of claim 10, further including outputting as the circuit design the layout of the circuit devices associated with the performances when said performances are within predetermined tolerances of the performance specifications.

12. The method of claim 10, wherein step (e) includes determining the performances of the circuit based on the size of each device and the parasitic effect of each conductor.

13. The method of claim 10, wherein step (f) includes forming an array of ratios, wherein each ratio represents changes in the value of one of the performances as a function of changes in the value of one of the device parameters.

14. The method of claim 10, wherein step (g) includes forming an array of ratios, wherein each ratio represents changes in the values of one of the performances as a function of changes in the value of one of the parasitic effects.

15. A method for designing integrated circuits, comprising:
    defining performance specifications for a circuit formed from a plurality of interconnected circuit devices;
    defining at least one constraint on the relative placement of each circuit device with respect to at least one other circuit device;
    laying out the circuit devices subject to each constraint, wherein each circuit device is assigned a size that establishes a device parameter therefor;
    routing conductors to electrically interconnect the laid out circuit devices whereupon the routing of each conductor establishes an electrical parasitic effect therefor;
    determining performances for the circuit from the layout of the circuit devices and the routing of the conductors;
    determining at least one relationship for changes in at least one performance, device parameter pair or at least one performance, parasitic effect pair; and
    improving at least one performance that is not within a predetermined tolerance of the corresponding performance specification by adjusting at least one circuit device or at least one conductor and determining a corresponding performance change according to the determined at least one relationship between changes in the values thereof.

16. The method of claim 15, wherein the at least one relationship includes an array of ratios that measure changes in performance values over changes in device parameter values.

17. The method of claim 15, wherein the at least one relationship includes an array of ratios that measure changes in performance values over changes in electrical parasitic effect values.

18. The method of claim 15, wherein improving at least one performance that is not within a predetermined tolerance of the corresponding performance specification includes resizing a chosen circuit device and updating at least one corresponding device parameter.

19. The method of claim 15, wherein improving at least one performance that is not within a predetermined tolerance of the corresponding performance specification includes repositioning a chosen device and updating at least one corresponding conductor routing.

20. A computer-readable medium that stores a computer program for designing integrated circuits, wherein the computer program includes instructions for:
    defining performance specifications for a circuit formed from a plurality of interconnected circuit devices;
    defining at least one constraint on the relative placement of each circuit device with respect to at least one other circuit device;
    laying out the circuit devices subject to each constraint, wherein each circuit device is assigned a size that establishes a device parameter therefor;
    routing conductors to electrically interconnect the laid out circuit devices whereupon the routing of each conductor establishes an electrical parasitic effect therefor;
    determining performances for the circuit from the layout of the circuit devices and the routing of the conductors;
    determining at least one relationship for changes in at least one performance, device parameter pair or at least one performance, parasitic effect pair; and
    improving at least one performance that is not within a predetermined tolerance of the corresponding performance specification by adjusting at least one circuit device or at least one conductor and determining a corresponding performance change according to the determined at least one relationship between changes in the values thereof.

21. The computer-readable medium of claim 20, wherein the at least one relationship includes an array of ratios that measure changes in performance values over changes in device parameter values.

22. The computer-readable medium of claim 20, wherein the at least one relationship includes an array of ratios that measure changes in performance values over changes in electrical parasitic effect values.

23. The computer-readable medium of claim 20, wherein improving at least one performance that is not within a predetermined tolerance of the corresponding performance specification includes resizing a chosen circuit device and updating at least one corresponding device parameter.

24. The computer-readable medium of claim 20, wherein improving at least one performance that is not within a predetermined tolerance of the corresponding performance specification includes repositioning a chosen device and updating at least one corresponding conductor routing.

* * * * *